(12) United States Patent
Taylor et al.

(10) Patent No.: US 9,509,640 B2
(45) Date of Patent: Nov. 29, 2016

(54) LATENCY CONTROL IN A TRANSMITTER/RECEIVER BUFFER

(71) Applicant: Xilinx, Inc., San Jose, CA (US)

(72) Inventors: David F. Taylor, Edinburgh (GB); Matthew H. Klein, Redwood City, CA (US); Vincent Vendramini, Dublin (IE)

(73) Assignee: XILINX, INC., San Jose, CA (US)

( * ) Notice: Subject to any disclaimer, the term of this patent is extended or adjusted under 35 U.S.C. 154(b) by 7 days.

(21) Appl. No.: 14/561,452

(22) Filed: Dec. 5, 2014

(65) Prior Publication Data

US 2016/0164665 A1 Jun. 9, 2016

(51) Int. Cl.
| | |
|---|---|
| H04K 1/10 | (2006.01) |
| G11C 7/00 | (2006.01) |
| H04L 12/861 | (2013.01) |
| H03L 7/06 | (2006.01) |
| G06F 5/10 | (2006.01) |
| G06F 5/06 | (2006.01) |
| H03M 9/00 | (2006.01) |
| G06F 5/12 | (2006.01) |

(52) U.S. Cl.
CPC ............... *H04L 49/90* (2013.01); *G06F 5/06* (2013.01); *G06F 5/10* (2013.01); *G06F 5/12* (2013.01); *H03L 7/06* (2013.01); *H03M 9/00* (2013.01); *G06F 2205/126* (2013.01)

(58) Field of Classification Search
CPC ............. H03L 7/06; H03L 1/00; H03L 7/23
USPC .......................................... 375/260; 365/201
See application file for complete search history.

(56) References Cited

U.S. PATENT DOCUMENTS

| | | | | |
|---|---|---|---|---|
| 5,655,113 A | * | 8/1997 | Leung .................... | G06F 13/40 711/167 |
| 6,598,086 B1 | * | 7/2003 | Bell, Jr. ............... | H04L 12/5693 370/230 |
| 6,606,666 B1 | * | 8/2003 | Bell, Jr. .................. | H04L 47/10 370/230 |
| 6,745,265 B1 | * | 6/2004 | Sindalovsky ............. | G06F 5/12 370/229 |
| 7,594,048 B1 | * | 9/2009 | Edwards .................. | G06F 5/12 710/52 |
| 8,665,928 B1 | * | 3/2014 | Klein ..................... | H04L 25/247 327/147 |
| 2001/0039602 A1 | * | 11/2001 | Kanda ................... | G11C 7/1021 711/105 |
| 2002/0015342 A1 | * | 2/2002 | Kuge ..................... | G11O 5/063 365/201 |
| 2002/0056021 A1 | * | 5/2002 | Manning ................... | G06F 5/06 711/105 |
| 2003/0156602 A1 | * | 8/2003 | Sage ....................... | H04B 3/542 370/480 |
| 2004/0252577 A1 | * | 12/2004 | Kwak .................. | G11C 7/1066 365/232 |

(Continued)

OTHER PUBLICATIONS

Specification and drawings for U.S. Appl. No. 14/486,820, filed Sep. 15, 2014, Novellini et al.

(Continued)

*Primary Examiner* — Daniel Washburn
*Assistant Examiner* — Sarah Hassan
(74) *Attorney, Agent, or Firm* — W. Eric Webostad

(57) ABSTRACT

In a method for buffering, a buffer buffers data responsive to read and write clock signals. A flag signal from the buffer is for a fill level thereof. The flag signal is toggled responsive to the data buffered being either above or below a set point for the fill level. A phase of the write clock signal is adjusted to a phase of the read clock signal responsive to the toggling of the flag signal. The write clock signal is used to control latency of the buffer. The adjusting of the phase of the write clock signal includes: generating an override signal responsive to the toggling of the flag signal; and inputting the read clock signal and the override signal to a phase adjuster to controllably adjust the phase of the write clock signal to the phase of the read clock signal during operation.

20 Claims, 5 Drawing Sheets

(56) References Cited

U.S. PATENT DOCUMENTS

| | | | |
|---|---|---|---|
| 2006/0020843 A1* | 1/2006 | Frodsham | G06F 13/4273 713/503 |
| 2007/0104014 A1* | 5/2007 | Dietrich | G06F 5/10 365/230.06 |
| 2008/0205448 A1* | 8/2008 | Tanahashi | G06F 13/4286 370/474 |
| 2009/0316493 A1* | 12/2009 | Kim | G11C 7/22 365/189.05 |
| 2011/0298508 A1* | 12/2011 | Wu | H04L 7/0337 327/157 |

OTHER PUBLICATIONS

Taylor, David et al., *All Digital VCXO Replacement for Gigabit Transceiver Applications*, XAPP589 (v2.1), Oct. 15, 2013, pp. 1-29, Xilinx, Inc., San Jose, California, USA.

* cited by examiner

LATENCY CONTROL IN A TRANSMITTER/RECEIVER BUFFER

TECHNICAL FIELD

The following description relates to integrated circuit devices ("ICs"). More particularly, the following description relates to latency control in a transmitter/receiver buffer for an IC.

BACKGROUND

Integrated circuits ("ICs") are commonly used in the communication of data. For transmitters transmitting and receivers receiving such data, phase interpolators may be used to adjust frequency of a reference clock signal to accommodate different data or line rates, which may be changed asynchronously. Unfortunately, this means that controlling operation of transmitter/receiver buffer latency is not available by such phase interpolators when they are in use for frequency adjustment. Hence, it is desirable and useful to provide latency control in a buffer without adding another phase interpolator to a transmitter or receiver.

SUMMARY

A method relates generally to buffering. In such a method, a buffer is operated to buffer data responsive to a read clock signal and a write clock signal provided to the buffer. A flag signal is obtained from the buffer responsive to fill level of the buffer by a state machine. The flag signal is toggled responsive to the data buffered being either above or below a set point for the fill level. A phase of the write clock signal is adjusted to a phase of the read clock signal responsive to the toggling of the flag signal. The write clock signal is output for the operating of the buffer with controlled latency thereof. The adjusting of the phase of the write clock signal includes: generating an override signal by the state machine responsive to the toggling of the flag signal; and inputting the read clock signal and the override signal to a phase adjuster to controllably adjust the phase of the write clock signal to the phase of the read clock signal during the operating of the buffer. The phase adjuster is configured to adjust delay of the read clock signal responsive to the override signal to align the phase of the write clock signal to the phase of the read clock signal for the adjusting.

A system relates generally to data processing and communication. In such a system, input circuitry is coupled to receive multiple data source inputs. A plurality of transmitters respectively provide clock signals for the multiple data source inputs and respectively coupled to receive channelized data streams for the multiple data source inputs from the input circuitry. The input circuitry and the plurality of transmitters are of a single integrated circuit package. The plurality of transmitters respectively include phase interpolators for frequency adjustment to respectively provide the clock signals. The plurality of transmitters respectively include transmit buffers coupled to provide controlled latencies respectively thereof.

A transmitter relates generally to the transmission of information. In such a transmitter, a transmit buffer is coupled to input data to buffer responsive to a write clock signal and to output the data buffered responsive to a read clock signal. A state machine is coupled to receive a flag signal from the transmit buffer to generate an override signal. A delay aligner is coupled to receive the read clock signal and the override signal from the state machine to provide the write clock signal. The transmit buffer is coupled to provide the flag signal responsive to a fill level of the transmit buffer. The delay aligner is coupled to controllably adjust a phase of the write clock signal to a phase of the read clock signal responsive to the override signal to provide the write clock signal for the transmit buffer.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

Transmitters, such as in Field Programmable Gate Arrays ("FPGAs") and other ICs, may control latency in transmit buffers thereof using phase interpolators respectively thereof. However, this latency control adjustment by a phase interpolator may mean that such a transmit buffer is bypassed during a control adjustment, namely, the transmit buffer is disabled from operating to buffer data. Furthermore, due to having various data sources with different data or line rates, which may change asynchronously, it is useful to have a phase interpolator of a transmitter adjust frequency of operation thereof, which means the phase interpolator may not be available to control latency of a transmit buffer.

U.S. Pat. No. 8,665,928 B1 describes in relevant part a method in which a SERDES PMA TX PI block can be controllably used to generate a new line rate under digital control. This means that rather than having external voltage controlled oscillators ("VCOs" or "VCXOs"), such VCO functions may be moved on-chip into corresponding phase interpolators. To further facilitate this and other applications for transmitters, a flag signal of a transmit buffer is used to provide an indication of the fill level thereof. This flag signal is effectively toggled for latency control of transfer of data through the transmit buffer. Accordingly, this toggling is performed while the transmit buffer is operating, and may be performed simultaneously with frequency adjustment by a phase interpolator of the transmitter. Though the above description was in terms of a transmitter or transmit buffer, the description likewise applies to a receiver or receive buffer.

With the above general understanding borne in mind, various configurations for latency control in a transmit buffer are generally described below.

Figure 1:
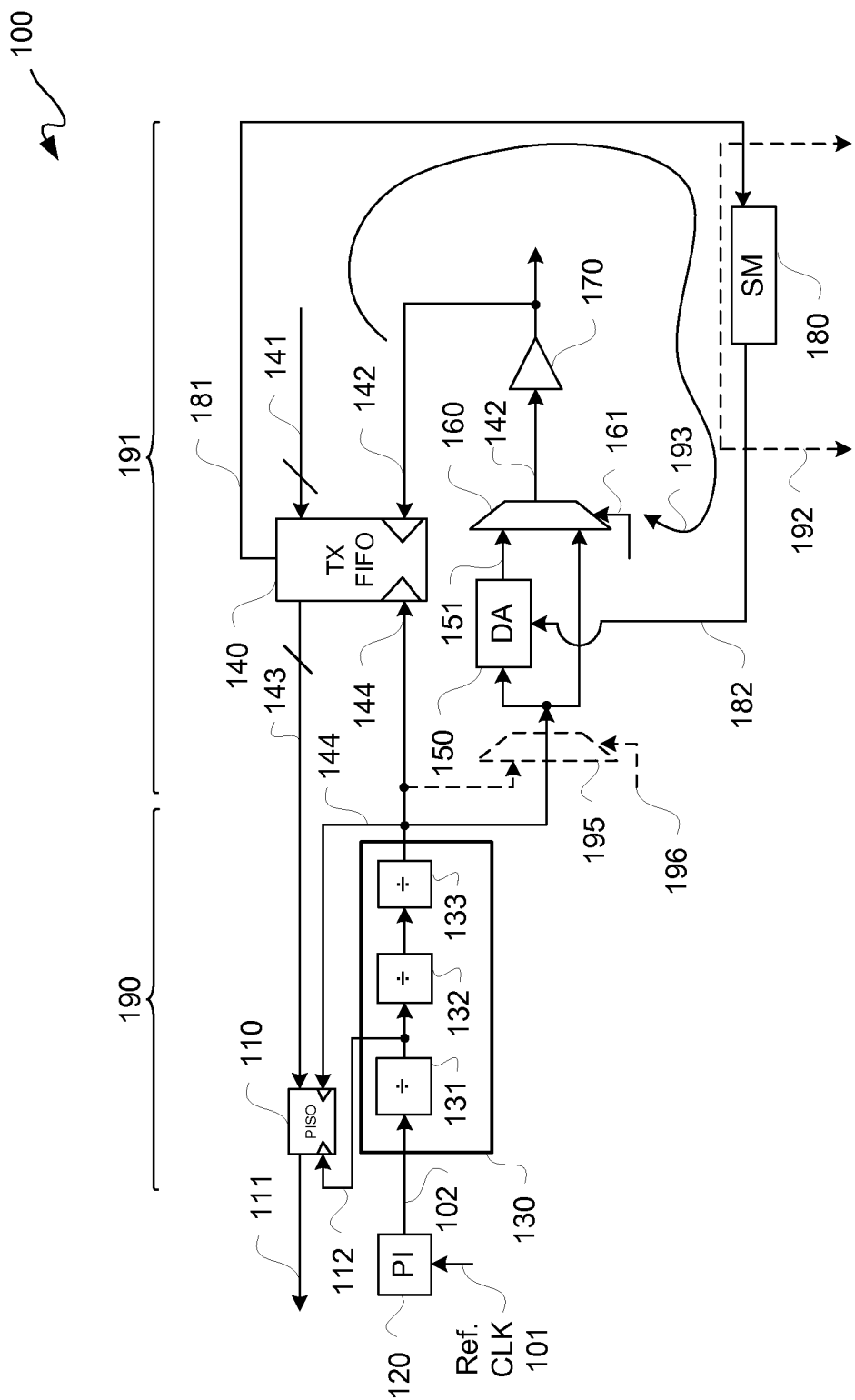
FIG. 1 is a schematic diagram depicting an exemplary transmitter.

FIG. 1 is a schematic diagram depicting an exemplary transmitter 100. Transmitter 100 in this example includes a parallel-to-serial converter or parallel-input, serial-output block ("PISO") 110, a phase interpolator ("PI") 120, a divider block 130, a transmit ("TX") buffer 140, a delay aligner ("DA") 150, a multiplexer 160, a clock driver 170, and a state machine ("SM") 180. Again, though the description herein is in terms of a transmitter buffer for purposes of clarity by way of example, the description is not limited to a transmitter buffer but likewise applies to a receiver buffer.

In this example, state machine 180 is a finite state machine implemented in programmable resources, such as of programmable fabric 192 of a Field Programmable Gate Array ("FPGA") or other IC. However, state machine 180 may be provided as a dedicated hardware block in another implementation.

In this example, transmit buffer 140 is a first-in, first-out buffer ("FIFO"). In other implementations, rather than a state machine 180 another type of controller may be used. Furthermore, in other implementations, another type of buffer may be used.

Moreover, transmitter 100 is modeled after a transmitter of a gigabit transceiver of an FPGA. Along those lines, many known details regarding a transmitter are omitted for purposes of clarity and not limitation. Generally, state machine 180 and a feedback control loop 193 may be added to a conventional transmitter to provide transmitter 100.

Transmit buffer 140 is coupled to input parallel transmit data 141 to buffer the data responsive to a write clock signal 142, and to output buffered transmit data 141 as parallel transmit data 143 responsive to a read clock signal 144. Read clock signal 144 is provided to a read-side clock port of transmit buffer 140, and write clock signal 142 is provided to a write-side clock port of transmit buffer 140. Transmit buffer 140 may be used to cross clock domains from a transmit ("TX") physical coding Sublayer ("PCS") clock domain, generally clock domain 191 associated with write clock signal 142, to a TX physical medium attachment ("PMA") sublayer clock domain, generally clock domain 190 associated with read clock signal 144.

A state machine 180 may be coupled to receive a flag signal 181 from transmit buffer 140 to generate an override signal 182. A delay aligner 150 may be coupled to receive read clock signal 144 from divider block 130 and override signal 182 from state machine 180. Delay aligner 150 may be configured to provide write clock signal 151 in response to read clock signal 144 and override signal 182, as described below in additional detail.

Transmit buffer 140 may be coupled to provide flag signal 181 responsive to a fill level of transmit buffer 140. Thus, for example, if half or more than half of transmit buffer 140 is full of buffered transmit data, transmit buffer 140 may assert flag signal 181, such as for example to transition from a logic low state to a logic high state. Moreover, for example, if less than half of transmit buffer 140 is full of buffered transmit data, transmit buffer 140 may not assert or may de-assert flag signal 181, such as for example to transition from a logic high state to a logic low state. Even though the example of a half full fill level is used for a half full flag signal 181, in other implementations fill levels other than half full level may be used. Accordingly, for purposes of clarity by way of example and not limitation, it shall be assumed that a half full fill level is used.

After a reset of transmit buffer 140, fill level of transmit buffer 140 may be unknown. State machine 180 may adjust delay of write clock signal 142 by either asserting or de-asserting override signal 182 provided to delay aligner 150. Effectively, state machine 180 may controllably adjust delay aligner 150 to find a ½ fill level set point of transmit buffer 140. This set point may be used to ensure transmit buffer 140 has a predetermined latency. For example, state machine 180 may effectively adjust delay of write clock signal 142 via override signal 182 until transmit buffer 140 is at least half full, and then adjust delay of write clock signal 142 via override signal 182 until transmit buffer 140 is less than half full. In short, state machine 180 may cause flag signal 181 to toggle, such as 1010101 . . . .

In this example, a TX FIFO half full flag signal 181 output from transmit buffer 140 may toggle relative to phase input of a transmit data clock, such as write clock signal 142. In this implementation, a half full flag signal 181 may be used to provide "bang-bang" phase detection as part of a feedback control loop 193. In another configuration, write clock signal 142 may be provided as a TX user clock signal, as described below in additional detail.

For delay of write clock signal 142 adjusted precisely, a relative phase difference between read clock signal 144 in a PMA clock domain 190 and write clock signal 142 in PCS clock domain 191 may be determined by toggling of flag signal 181. Additionally, a half full flag signal 181 may indicate the depth of transmit buffer 140 by a location in time of when a transition from a logic 0 to a logic 1 of the flag signal 181 occurs. By holding flag signal in a toggling state, whether by a control loop or feedback loop 193 as described herein, latency through transmit buffer 140 may be controlled and may be deterministic.

In this example, information from half full flag signal 181 is used to drive and state machine 180 is used to adjust a serializer-deserializer ("SERDES") TX delay aligner 150. A multiplexer 160 may be coupled to receive write clock signal 151 output from delay aligner 150, and multiplexer 160 may be coupled to receive read clock signal 144. Multiplexer 160 may be coupled to receive a control select signal 161 to select between clock signals 144 and 151 to provide either as write clock signal 142 to transmit buffer 140. A clock driver 170 may be coupled to receive write clock signal 142 output from multiplexer 160 to provide a buffered version of the write clock signal to a write-side clock input port of transmit buffer 140. In a TX delay bypass mode, delay aligner 150 may be bypassed to provide read clock signal 144 as write clock signal 142; however, in this mode, there is no adjustment of delay of write clock signal 142 input to transmit buffer 140. Accordingly, variations due to process, voltage, and/or temperature ("PVT") may negatively impact operation of transmitter without PVT delay compensation provided by delay aligner 150.

However, in the past, PVT delay compensation provided by delay aligner 150 was for a buffer bypass mode, namely transmit buffer 140 was disabled when using delay aligner 150. In this implementation, transmit buffer 140 is operating while delay aligner 150 is operating to controllably adjust phase of write clock signal 151 to phase of read clock signal 144 responsive to override signal 182 to provide write clock signal 142 for transmit buffer 140.

A phase interpolator 120 may be coupled to receive a reference clock signal 101 or other clock signal. Phase interpolator 120 may be coupled to adjust frequency of a parallel-input, serial-output clock signal 102 responsive to reference clock signal 101, such as described in additional detail in U.S. Pat. No. 8,665,928 B1, which is incorporated by reference herein in its entirety for all purposes. Along those lines, a frequency adjusted parallel-input, serial-output clock signal 102 from phase interpolator 120 may be provided as an input to divider block 130. Divider block 130 may have one or more dividers coupled in series, such as dividers 131 through 133 in this example.

A tap between two of dividers 131 through 133 may be used to provide a serial output clock signal 112 to an output clock port of parallel-to-serial converter 110, and a subsequent tap of dividers 131 through 133 may be used to provide read clock signal 144. This read clock signal 144 may be provided to an input clock port of parallel-to-serial converter 110 as a PMA clock domain 190 parallel input clock signal 144. Parallel input clock signal 144 may be at a lower frequency than serial output clock signal 112 to write in parallel transmit data 143 to parallel-to-serial converter 110 and to read out transmit data 111 from parallel-to-serial converter 110.

Thus, generally, transmit buffer 140 may be coupled through divider block 130 to receive a frequency adjusted parallel-input, serial-output clock signal 102 from phase interpolator 120 to obtain a read clock signal 144 as a frequency divided down version of the parallel-input, serial-output clock signal 102. As a data output port of transmit buffer 140 is coupled to a data input port of parallel-to-serial converter 110, parallel transmit data 143 may be read out of transmit buffer 140 responsive to read clock signal 144 and written into parallel-to-serial converter 110 responsive to read clock signal 144.

Optionally, read clock signal 144 input to delay aligner 150 and to multiplexer 160 may be obtained from a PMA clock domain 190 or a PCS clock domain 191. In the above-described example, read clock signal 144 input to delay aligner 150 and to multiplexer 160 was obtained from PMA clock domain 190. However, another tap and path, as well as an optional multiplexer 195 and a control select signal 196 may be provided to select a read clock signal 144 from either a PMA clock domain 190 or a PCS clock domain 191 for input to delay aligner 150 and to multiplexer 160. However, in either instance, phase of read clock signal 144 may be a static or a reference phase during operation of transmit buffer 140, and phase of write clock signal 142 may be adjusted to the static or reference phase of read clock signal 144.

Accordingly, a TX phase interpolator 120 may be used for frequency control while simultaneously using a transmit buffer 140 for buffering transmit data with phase detection for latency control. Along those lines, a PMA TX phase interpolator may be controllably used to generate a new or different line rate under digital control, such as described in U.S. Pat. No. 8,665,928 B1, while latency is controlled by control loop 193 as described above. Heretofore, using a TX phase interpolator 120 for frequency control was mutually exclusive with latency control while operating a transmit buffer 140. However, as described above, a flag signal 181 from a transmit buffer 140 may be used as a phase detection mechanism, such as within a SERDES. Along those lines, a phase of a write clock 142 may be adjusted relative to static or reference phase of a read clock 144 of transmit buffer 140 to provide a controlled and determined for latency through transmit buffer 140.

Figure 2:
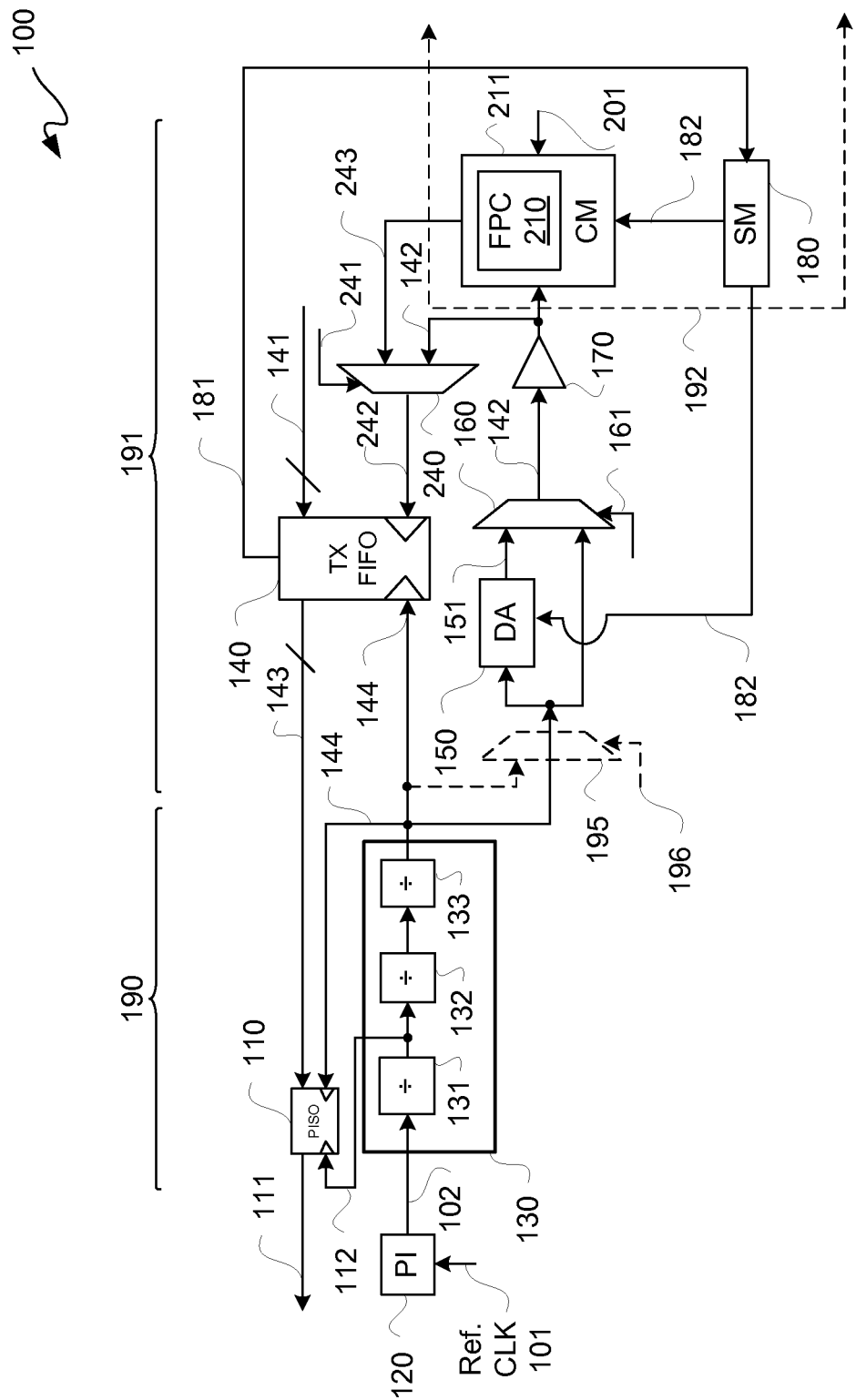
FIG. 2 is a schematic diagram depicting another exemplary transmitter.

FIG. 2 is a schematic diagram depicting an exemplary transmitter 100. Transmitter 100 of FIG. 2 may be the same as transmitter 100 of FIG. 1, except with the following differences.

In transmitter 100 of FIG. 2, a clock module ("CM") 211 of an FPGA or other IC is coupled to receive a user clock signal 201. Clock module 211 may have a fine phase controller ("FPC") 210. As is known, clock module 211 may be a programmable resource of an FPGA or other IC in programmable fabric 192 thereof.

Override signal 182 may be provided to fine phase controller 210 to adjust phase of user clock signal 201 to provide write clock signal 242 to a write-side clock input port of transmit buffer 140. Along those lines, fine phase controller 210 may be coupled to receive write clock signal 142 from clock driver 170 and user clock signal 201 to compare phases thereof for such an adjustment of the phase of user clock signal 201. In this mode, delay aligner 150 may be used to adjust delay to control for PVT variation.

A write clock 142 from clock driver 170 may be input to a multiplexer 240 of transmitter 100. A write clock signal 243 output from fine phase controller 210 may be input to multiplexer 240. A control select signal 241 may be provide to multiplexer 240 to select either of clock signals 142 or 243 as write clock signal 242.

Information from override signal 182 may be used by fine phase controller 210 to adjust phase of write clock signal 243 to cause flag signal 181 to toggle, as previously described. For write clock signal 243 selected as write clock signal 242, this toggling is for adjusting phase of write clock signal 242 sourced from a user clock signal 201 in a user clock signal domain. Optionally, fine phase control 210 may be used to adjust phase of write clock signal 142 to provide write clock signal 243 instead of using delay aligner 150.

Figure 3:
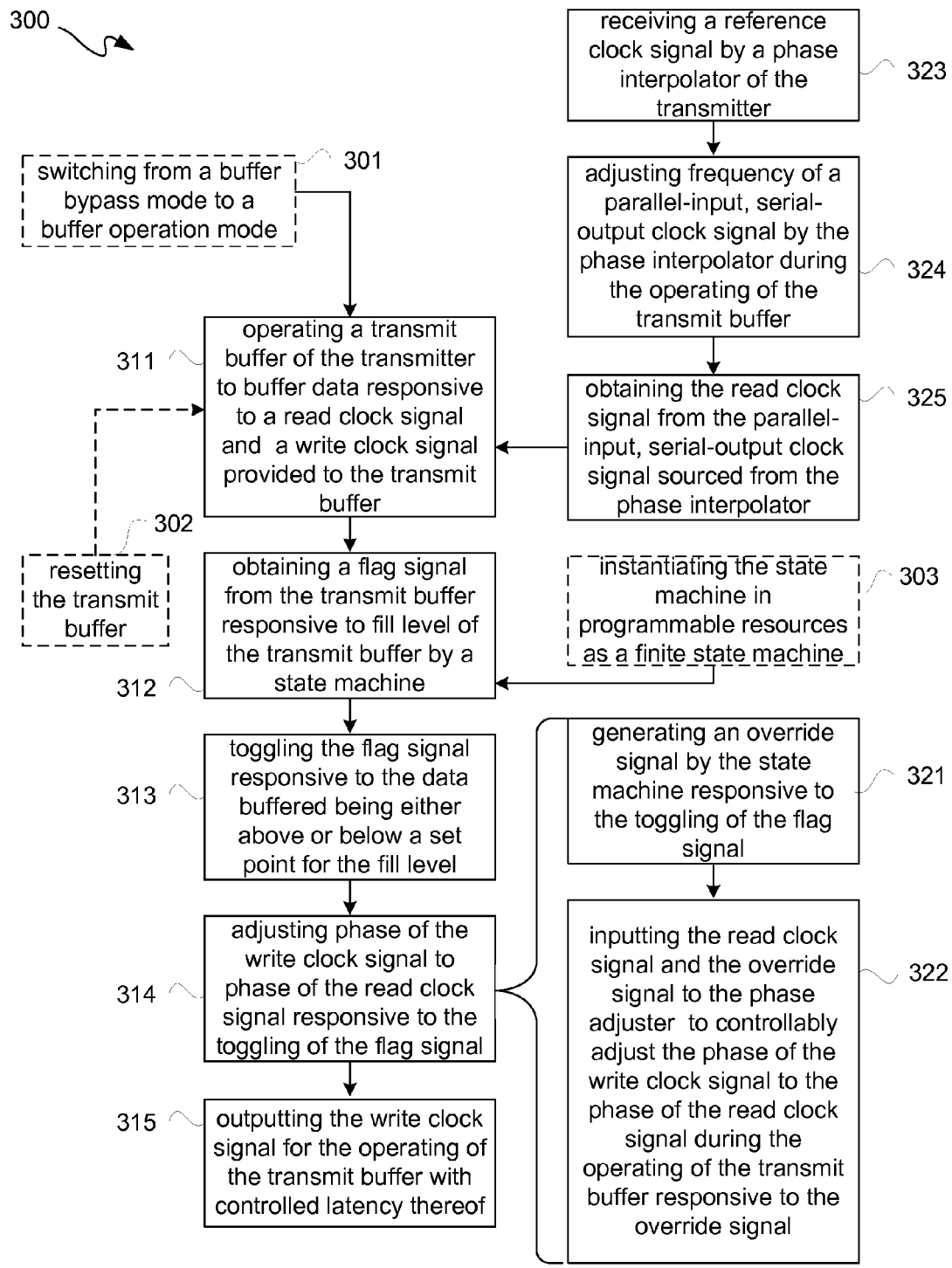
FIG. 3 is a flow diagram depicting an exemplary transmitter operation flow.

FIG. 3 is a flow diagram depicting an exemplary transmitter operation flow 300. Transmitter operation flow 300 is further described with simultaneous reference to FIGS. 1-3.

At 311, a transmit buffer 140 of a transmitter 100 may be operating to buffer data responsive to a write clock signal 142 or 242 and a read clock signal 144 provided to transmit buffer 140. This operational state of transmit buffer 140 may optionally be entered from switching from a buffer bypass mode to a buffer operation mode at 301. This operational state of transmit buffer 140 may be entered after resetting thereof at 302. A transmit buffer 140 may be reset for any of a number of reasons, including without limitation upon startup, a change in a line rate, or a change in a data input feed.

At 312, a flag signal 181 from transmit buffer 140 may be obtained responsive to the fill level of transmit buffer 140 by a state machine 180. Optionally, at 303, a state machine 180 may be instantiated in programmable resources, such as of an FPGA or other IC, as a finite state machine for use at 312.

At 313, flag signal 181 may be toggled responsive to the amount of data buffered in transmit buffer 140 being either above or below a set point for the fill level. At 314, phase of write clock signal 142 or 242 may be adjusted to phase of read clock signal 144 responsive to the toggling at 312 of flag signal 181. At 315, write clock signal 142 or 242 may be output for input to and operation of transmit buffer 140 with controlled latency thereof. Thus, latency of transmit buffer 140 may be controlled while operating the transmit buffer.

Adjusting the phase of write clock signal 142 or 242 at 314 may include operations at 321 and 322. At 321, an override signal 182 may be generated by state machine 180 responsive to the toggling at 312 of flag signal 181.

At 322, a read clock signal 144 and override signal 182 may be input to a phase adjuster to controllably adjust phase of write clock signal 142 or 242 to phase of read clock signal 144 during or while operating transmit buffer 140. The phase adjuster is configured to adjust delay of read clock signal 144 responsive to override signal 182 to align phase of write clock signal 142 or 242 to the phase of read clock signal 144 for the adjusting. As previously described, the phase adjuster may be delay aligner 150 or a fine phase controller 210 of a clock module 211, for example. The phase of write clock signal 142 or 242 may be adjusted by adjustment of the delay for a set point of a fill level of transmit buffer 140, which may be a set point for a half full fill level.

Read clock signal 144 used for operation of transmit buffer 140 at 311 may be a frequency adjusted read clock signal. The frequency adjustment of read clock signal 144 may operate at the same time as operation of transmit buffer 140 at 311. Read clock signal 144 for operating transmit buffer 140 at 311 may be adjusted with operations 323 through 325.

At 323, a reference clock signal 101 may be received by a phase interpolator 120 of transmitter 100. At 324, frequency of a parallel-input, serial-output clock signal 102 may be adjusted by phase interpolator 120 during or while operating transmit buffer 140 for buffering data at 311. At 325, read clock signal 144 may be obtained from parallel-input, serial-output clock signal 102 sourced from phase interpolator 120. Read clock signal 144 may be a divided down version of parallel-input, serial-output clock signal 102.

Accordingly, it should be understood from the above description, the following operations or functions may occur simultaneously during operation of transmitter 100: phase interpolator 120 may perform frequency adjustment; delay aligner 150 may compensate for PVT delay; and transmit buffer 140 may provide signaling for the control of latency of data through the buffer while buffering data. Along those lines, an FPGA or other IC configured with a plurality of transmitters 100 may be used for phase-shifting with output voltage controlled oscillators ("VCOs")/phase-locked loops ("PLLs") being located internal to such FPGA or other IC with frequency adjustment, PVT delay compensation, and buffer latency control occurring simultaneously in each of transmitters 100.

Figure 4:
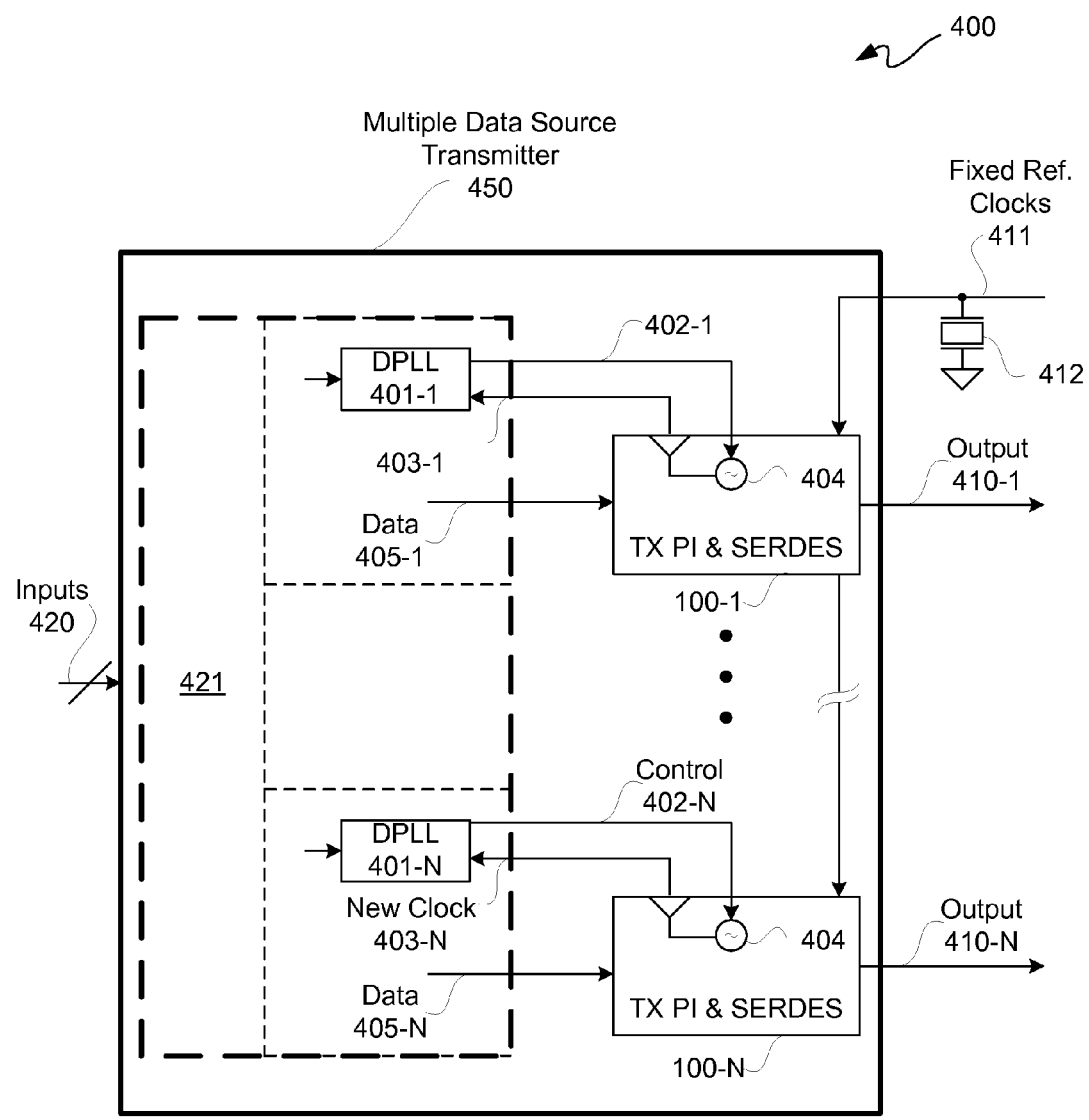
FIG. 4 is a block diagram depicting an exemplary system for data processing and communication.

FIG. 4 is a block diagram depicting an exemplary system 400 for data processing and communication. A plurality of data inputs 420 may be from a plurality of different data sources. Along those lines, the data sources may transmit data in different formats, different data rates, and/or other differences. Data inputs 420 may provide data to a multiple data source transmitter 450, which may be a single FPGA or IC package. The input data streams may optionally have data thereof processed internally in multiple data source transmitter 450 before channelizing to a plurality of different output destinations associated with outputs 410-1 through 410-N from multiple data source transmitter 450. Input circuitry 421 of multiple data source transmitter 450 may be coupled to receive multiple data source inputs 420 and may include demultiplexers, switches, a router, and/or a channelizer, which may generally be considered a routing and switching function. Accordingly, processed data may be channelized by input circuitry 421 into data streams 405-1 through 405-N corresponding to outputs 410-1 through 410-N.

Input circuitry 421 may be coupled to a plurality of FIFOs and rate generators, such as described with reference to FIG. 3 of "All Digital VCXO Replacement for Gigabit Transceiver Applications" by David Taylor, Matt Klein, and Vincent Vendramini, Xilinx application note XAPP589 (v2.1) Oct. 15, 2013, for example. Multiple data source transmitter 450, via such rate generators, may provide clock rates to corresponding digital PLLs ("DPLLs") 401-1 through 401-N and via such FIFOs may provide data streams 405-1 through 405-N to corresponding transmitters 100-1 through 100-N.

DPLLs 401-1 through 401-N may respectively provide control information via control signals 402-1 through 402-N to respective VCOs 404 of transmitters 100-1 through 100-N, respectively. The plurality of transmitters 100-1 through 100-n, which may be respective instances of transmitters 100 having a TX phase interpolator 120 and configured for parallel-to-serial conversion for a SERDES, may respectively provide clock signals 403-1 through 403-N for multiple data source inputs 420 to DPLLs 401-1 through 401-N. Accordingly, clock signals 403-1 through 403-N may be frequency adjusted corresponding to received channelized data streams 405-1 through 405-N for data from multiple data source inputs 420, provided via input circuitry 421.

Accordingly, phase interpolators 120 respectively of transmitters 100-1 through 100-N may provide frequency adjustment to respective clock signals 403-1 through 403-N while simultaneously controlling latency through transmit buffers 140 respectively thereof. Transmitters 100-1 through 100-N may respectively buffer data from data streams 405-1 through 405-N via corresponding transmit buffers 140 coupled to provide controlled latencies respectively thereof for providing outputs 410-1 through 410-N, respectively. Each of transmitters 100-1 through 100-N may be coupled to receive at least one external reference signal with a clock pattern from fixed reference clock signals 411, which may be sourced from a common external oscillator circuit 412.

For a receiver buffer implementation, a corollary of write clock of a transmitter buffer, as described above, is a read clock of a receiver buffer. However, phase may be varied to provide latency control in the same way for both receiver and transmitter buffers provided however the same clock port on a receiver buffer is a read clock for data flow an opposite direction with reference to a write clock for a transmitter buffer. For an FPGA fabric implementation, the same fabric-side clock that gets acted on by a half full flag is called a write clock in a transmitter buffer and a read clock in a receiver buffer.

Because one or more of the examples described herein may be implemented in an FPGA, a detailed description of such an IC is provided. However, it should be understood that other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 5:
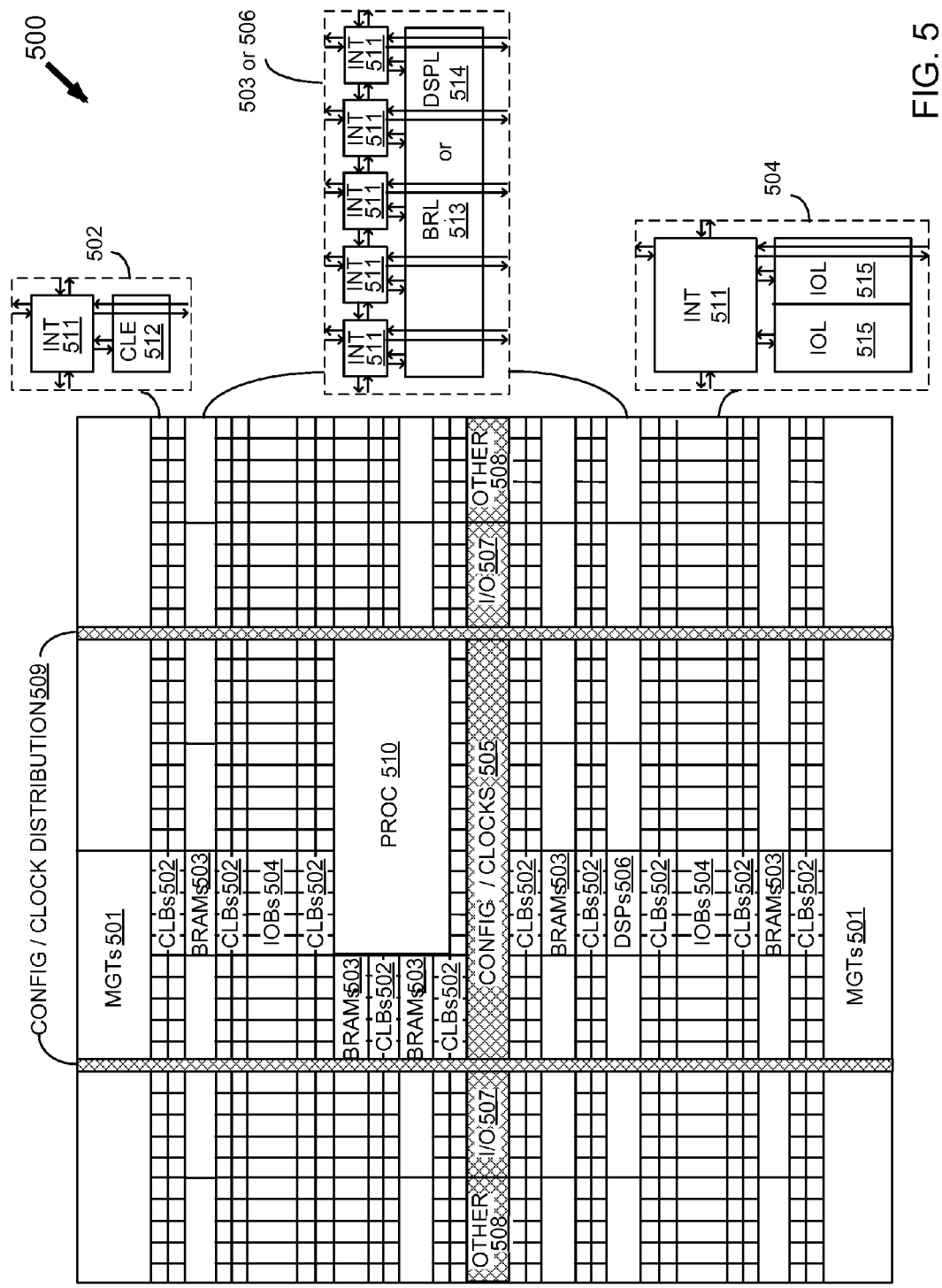
FIG. 5 is a simplified block diagram depicting an exemplary columnar Field Programmable Gate Array ("FPGA") architecture.

As noted above, advanced FPGAs can include several different types of programmable logic blocks in the array. For example, FIG. 5 illustrates an FPGA architecture 500 that includes a large number of different programmable tiles including multi-gigabit transceivers ("MGTs") 501, configurable logic blocks ("CLBs") 502, random access memory blocks ("BRAMs") 503, input/output blocks ("IOBs") 504, configuration and clocking logic ("CONFIG/CLOCKS") 505, digital signal processing blocks ("DSPs") 506, specialized input/output blocks ("I/O") 507 (e.g., configuration ports and clock ports), and other programmable logic 508 such as digital clock managers, analog-to-digital converters, system monitoring logic, and so forth. Some FPGAs also include dedicated processor blocks ("PROC") 510.

In some FPGAs, each programmable tile includes a programmable interconnect element ("INT") 511 having standardized connections to and from a corresponding interconnect element in each adjacent tile. Therefore, the programmable interconnect elements taken together implement the programmable interconnect structure for the illustrated FPGA. The programmable interconnect element 511 also includes the connections to and from the programmable logic element within the same tile, as shown by the examples included at the top of FIG. 5.

For example, a CLB 502 can include a configurable logic element ("CLE") 512 that can be programmed to implement user logic plus a single programmable interconnect element ("INT") 511. A BRAM 503 can include a BRAM logic element ("BRL") 513 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 506 can include a DSP logic element ("DSPL") 514 in addition to an appropriate number of programmable interconnect elements. An 10B 504 can include, for example, two instances of an input/output logic element ("IOL") 515 in addition to one instance of the programmable interconnect element 511. As will be clear to those of skill in the art, the actual I/O pads connected, for example, to the I/O logic element 515 typically are not confined to the area of the input/output logic element 515.

In the pictured embodiment, a horizontal area near the center of the die (shown in FIG. 5) is used for configuration, clock, and other control logic. Vertical columns 509 extending from this horizontal area or column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, processor block 510 spans several columns of CLBs and BRAMs.

Note that FIG. 5 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 5 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. A method for buffering, comprising:
   operating a buffer to buffer data responsive to a read clock signal and a write clock signal provided to the buffer;
   obtaining a flag signal from the buffer responsive to fill level of the buffer by a state machine;
   toggling the flag signal responsive to the data buffered being either above or below a set point for the fill level;
   adjusting a phase of the write clock signal to a phase of the read clock signal responsive to the toggling of the flag signal; and
   outputting the write clock signal for the operating of the buffer with controlled latency thereof, wherein the latency of the buffer is controlled responsive to the adjusting;
   wherein the adjusting of the phase of the write clock signal comprises:

generating an override signal by the state machine responsive to the toggling of the flag signal; and inputting the read clock signal and the override signal to a phase adjuster to controllably adjust the phase of the write clock signal to the phase of the read clock signal during the operating of the buffer;

wherein the phase adjuster is configured to adjust delay of the read clock signal responsive to the override signal to align the phase of the write clock signal to the phase of the read clock signal for the adjusting.

2. The method according to claim 1, wherein the phase of the write clock signal is adjusted by adjustment of the delay for the set point of the fill level of the buffer at a half full level.

3. The method according to claim 1, further comprising resetting the buffer.

4. The method according to claim 1, further comprising switching from a buffer bypass mode to a buffer operation mode for operation of the buffer.

5. The method according to claim 1, further comprising:
receiving a reference clock signal by a phase interpolator;
adjusting frequency of a parallel-input, serial-output clock signal by the phase interpolator during the operating of the buffer; and
obtaining the read clock signal from the parallel-input, serial-output clock signal sourced from the phase interpolator.

6. The method according to claim 5, wherein the read clock signal is a divided down version of the parallel-input, serial-output clock signal.

7. The method according to claim 6, further comprising instantiating the state machine in programmable resources as a finite state machine.

8. The method according to claim 1, wherein the phase adjuster comprises a delay aligner.

9. The method according to claim 1, wherein the phase adjuster comprises a phase controller of a clock module.

10. A system for data processing and communication, comprising:
input circuitry coupled to receive multiple data source inputs;
a plurality of transmitters respectively providing clock signals for the multiple data source inputs and respectively coupled to receive channelized data streams for the multiple data source inputs from the input circuitry;
wherein the input circuitry and the plurality of transmitters are of a single integrated circuit package;
wherein the plurality of transmitters respectively include phase interpolators for frequency adjustment to respectively provide the clock signals;
wherein the plurality of transmitters respectively include transmit buffers coupled to provide controlled latencies respectively thereof; and
wherein each of the plurality of transmitters comprises:
a transmit buffer configured to input data responsive to a write clock signal, output the data buffer responsive to a read clock signal, and provide a flag signal responsive to a fill level of the transmit buffer; and
a delay aligner configured to controllably adjust a phase of the write clock signal to a phase of the read clock signal to provide the write clock signal for the transmit buffer for controlled latency of the transmit buffer responsive to adjustment of the phase of the write clock signal.

11. The system according to claim 10, wherein the integrated circuit package further comprises a plurality of digital phase-locked loops respectively coupled to receive the clock signals and further respectively coupled to the plurality of transmitters to provide control signals thereto.

12. The system according to claim 11, wherein each of the plurality of transmitters is coupled to receive at least one external reference signal with a clock pattern.

13. The system according to claim 11, wherein each of the plurality of transmitters further comprises:
a state machine coupled to receive the flag signal from the transmit buffer to generate an override signal;
wherein the delay aligner is coupled to receive the read clock signal and the override signal from the state machine to provide the write clock signal; and
wherein the delay aligner is coupled to controllably adjust the phase of the write clock signal to the phase of the read clock signal responsive to the override signal to provide the write clock signal for the transmit buffer for the controlled latency thereof.

14. A transmitter, comprising:
a transmit buffer coupled to input data to buffer responsive to a write clock signal and to output the data buffered responsive to a read clock signal;
a state machine coupled to receive a flag signal from the transmit buffer to generate an override signal;
a delay aligner coupled to receive the read clock signal and the override signal from the state machine to provide the write clock signal;
wherein the transmit buffer is coupled to provide the flag signal responsive to a fill level of the transmit buffer;
wherein the delay aligner is coupled to controllably adjust a phase of the write clock signal to a phase of the read clock signal responsive to the override signal to provide the write clock signal for the transmit buffer; and
wherein latency of the transmit buffer is controlled responsive to adjustment of the phase of the write clock signal.

15. The transmitter according to claim 14, further comprising:
a phase interpolator coupled to receive a reference clock signal;
wherein the phase interpolator is coupled to adjust frequency of a parallel-input, serial-output clock signal responsive to the reference clock signal; and
divider block coupled to receive the parallel-input, serial-output clock signal from the phase interpolator to provide the read clock signal as a divided down version of the parallel-input, serial-output clock signal.

16. The transmitter according to claim 15, further comprising:
a parallel-to-serial converter coupled to the transmit buffer to receive the data therefrom responsive to the read clock signal;
wherein the read clock signal is provided to the parallel-to-serial converter as an input clock signal.

17. The transmitter according to claim 16, wherein the divider block is coupled to provide an output clock signal to the parallel-to-serial converter.

18. The transmitter according to claim 16, further comprising a multiplexer coupled to receive the write clock signal from the delay aligner and further coupled to receive the read clock signal from the divider block to select either as the write clock signal to provide to the transmit buffer.

19. The transmitter according to claim 18, further comprising a clock driver coupled to the multiplexer to receive the write clock signal selected to provide to the transmit buffer.

20. The transmitter according to claim 19, wherein the phase of the read clock signal is static.

\* \* \* \* \*